(12) United States Patent
Panier et al.

(10) Patent No.: US 10,530,342 B2
(45) Date of Patent: Jan. 7, 2020

(54) CLOCK DISTRIBUTION

(71) Applicant: SOCIONEXT INC., Yokohama-shi, Kanagawa (JP)

(72) Inventors: Sylvain Panier, Maidenhead (GB); Behzad Farzaneh, Maidenhead (GB); Darren Walker, Reading (GB); Ian Juso Dedic, Northolt Middlesex (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/244,025

(22) Filed: Jan. 9, 2019

(65) Prior Publication Data

US 2019/0229711 A1    Jul. 25, 2019

(30) Foreign Application Priority Data

Jan. 19, 2018  (EP) .................................... 18152582

(51) Int. Cl.
*H03K 3/017* (2006.01)
*H03K 3/012* (2006.01)
*G06F 1/10* (2006.01)

(52) U.S. Cl.
CPC ............... *H03K 3/012* (2013.01); *G06F 1/10* (2013.01); *H03K 3/017* (2013.01)

(58) Field of Classification Search
CPC ........... H03K 3/012; H03K 3/017; G06F 1/10
USPC .......................................... 327/170, 172–176
See application file for complete search history.

(56) References Cited

U.S. PATENT DOCUMENTS

| | | | |
|---|---|---|---|
| 7,496,155 B1 | 2/2009 | Lu et al. | |
| 8,004,331 B2 | 8/2011 | Li et al. | |
| 8,384,457 B2 | 2/2013 | Ozgun et al. | |
| 8,536,917 B2* | 9/2013 | Hertle ................. | H03K 5/1565 327/172 |
| 9,319,039 B2 | 4/2016 | Roytman et al. | |
| 9,641,165 B1* | 5/2017 | Mooraka ................. | H03K 5/06 |
| 2008/0150600 A1* | 6/2008 | Taylor .................... | H03K 5/156 327/175 |
| 2010/0301913 A1 | 12/2010 | Li et al. | |
| 2012/0081163 A1* | 4/2012 | Hesen ................. | H03K 5/1565 327/175 |
| 2013/0285726 A1 | 10/2013 | Roytman et al. | |

(Continued)

OTHER PUBLICATIONS

Extended European Search Report issued corresponding European Patent Application No. 18152582.5 dated Jul. 12, 2018.

*Primary Examiner* — Tomi Skibinski
(74) *Attorney, Agent, or Firm* — Arent Fox LLP

(57) ABSTRACT

Clock distribution circuitry configured for duty cycle control, the circuitry comprising: a plurality of buffers connected in series along a clock path, each of the buffers having an input terminal and an output terminal, the input terminal being connected to the clock path via a corresponding AC coupling capacitor, and the clock, path configured to receive an input clock signal at its input node and output an output clock signal at its output node, the output clock signal having an output duty cycle; and control circuitry connected to apply a DC bias signal to the input terminal of each of the plurality of buffers, wherein the control circuitry is configured to: obtain a measurement signal indicative of the output duty cycle; and control the DC bias signals, based on a difference between the measurement signal and a reference signal, so as to control the output duty cycle.

10 Claims, 6 Drawing Sheets

(56) References Cited

U.S. PATENT DOCUMENTS

2015/0244321 A1\* 8/2015 Suda ................ H03K 3/017
 327/175

\* cited by examiner

CLOCK DISTRIBUTION

CROSS-REFERENCE TO RELATED APPLICATION

This application claims priority from European Patent Application No 18152582.5 filed Jan. 19, 2018. The entire contents of the prior application are incorporated in by reference.

The present invention relates to clock distribution circuitry and associated methods, and particularly to clock distribution circuitry configured for duty cycle control.

In particular, the present invention relates to clock distribution circuitry for example for use in circuitry requiring significant accuracy in the properties of a clock signal, specifically the duty cycle of a clock signal (for example in DAC circuitry where both edges of a clock signal are used—instead of only one of them—to reduce power consumption). Such clock distribution (or transmission) circuitry may be implemented as integrated circuitry, for example on an IC chip.

In such circuitry, one or more clock signals may be distributed or transmitted from one circuit stage (e.g. a clock source) to another (e.g. clocked circuitry such as ADC or DAC circuitry). Such clocked circuitry may for example require one or more clock signals to be very accurate, so that its operation may also be very accurate.

With increasing speeds of such clocked circuitry, and thus of the clock signals that they employ, coupled with corresponding miniaturisation of semiconductor device sizes, and an increased focus on reducing energy consumption, there is ever-increasing pressure on operating such clocked circuitry accurately and at low power. This places a significant burden on clock distribution circuitry which provides the clocked circuitry with its clock signals.

It is desirable to provide improved clock distribution circuitry in the light of the above.

According to an embodiment of a first aspect of the present invention, there is provided clock distribution circuitry configured for duty cycle control, the circuitry comprising: a plurality of buffers connected in series along a clock path having an input node and an output node, each of the buffers having an input terminal and an output terminal, the input terminal being connected to the clock path via a corresponding AC coupling capacitor, and the clock path configured to receive an input clock signal at the input node and output an output clock signal at the output node, the output clock signal having an output duty cycle; and control circuitry connected to apply a DC bias signal (via a high impedance component) to the input terminal of each of the plurality of buffers, wherein the control circuitry is configured to: obtain a measurement signal indicative of the output duty cycle; and control the DC bias signals, based on a difference between the measurement signal and a reference signal, so as to control the output duty cycle.

Such circuitry enables the duty cycle of a clock signal to be controlled, i.e. adjusted, so that the duty cycle of the clock signal, which may be supplied to other circuitry, is correct to within a certain required accuracy. Such duty cycle control/adjustment may be carried out during the operation of the circuitry to which the clock signal is supplied.

The control circuitry may comprise low-pass filter circuitry configured to receive the output clock signal or another clock signal from along the clock path and to output the measurement signal, the measurement signal being indicative of a DC-level of the output clock signal.

The reference signal may be indicative of a target duty cycle, and the control circuitry may be configured to control the DC bias signals to bring the output duty cycle towards or to the target duty cycle.

The buffers may be inverting buffers, each buffer being either a first buffer which outputs a clock signal which is inverted compared to the input clock signal of the clock path or a second buffer which outputs a clock signal which is not inverted compared to the input clock signal of the clock path.

The plurality of buffers may be a first plurality of buffers, the clock path may be a first clock path, the input node may be a first input node, the output node may be a first output node, the output duty cycle may be a first output duty cycle and the measurement signal may be a first measurement signal; the clock distribution circuitry may comprise a second said plurality of buffers connected in series along a second said clock path having a second input node and a second output node, the second clock path configured to receive a second input clock signal at the second input node and output a second output clock signal at the second output node, the second output clock signal having a second output duty cycle; the control circuitry may be connected to apply a DC bias signal to the input terminal of each of the second plurality of buffers; and the control circuitry may be configured to obtain a second measurement signal indicative of the second output duty cycle, and to control the DC bias signals, based on a difference between the first and second measurement signals, the second measurement signal being said reference signal, so as to control the first and second output duty cycles.

Such circuitry enables the duty cycle of two clock signals to be controlled, i.e. adjusted, so that the duty cycles of both clock signals, which may be supplied to other circuitry, are correct to within a certain required accuracy. Such duty cycle control/adjustment may be carried out during the operation of the circuitry to which the clock signals are supplied.

The control circuitry may be configured to control the DC bias signals to bring the first and second output duty cycles towards or to one another.

In other words, such clock distribution circuitry enables the duty cycle of two clock signals to be controlled i.e. adjusted so that, for example, the duty cycle of one clock signal is the same as the duty cycle of the other clock signal (to within a required accuracy).

The control circuitry may comprise low-pass filter circuitry configured to: receive the first output clock signal or another clock signal from along the first clock path and output the first measurement signal, the first measurement signal being indicative of a DC-level of the first output clock signal; and receive the second output clock signal or another clock signal from along the second clock path and output the second measurement signal, the second measurement signal being indicative of a DC-level of the second output clock signal.

The low-pass filter circuitry may be a differential low-pass filter.

The buffers may be inverting buffers, and each of said buffers may be either: a first buffer which is in the first clock path and outputs a clock signal which is inverted compared to the first input clock signal or is in the second clock path and outputs a clock signal which is not inverted compared to the second input clock signal; or a second buffer which is in the second clock path and outputs a clock signal which is inverted compared to the second input clock signal or is in the first clock path and outputs a clock signal which is not inverted compared to the first input clock signal.

The first and second input clock signals may be complementary clock signals, in the sense that they may have the same frequency and be 180 degrees out of phase with each other (within some defined tolerance). In other words, the phase difference between the first and second input clock signals may be substantially 180 degrees. In other words, the first and second clock signals may be in antiphase with each other. Similarly, the first and second output clock signals may be complementary clock signals.

The first and second clock paths may comprise the same number of said buffers as one another; and the clock distribution circuitry may further comprise at least one cross-coupled pair of inverters connected between corresponding nodes along the first and second clock paths.

In other words, there may be a cross-coupled pair of inverters connected between a first-stage buffer (not necessarily a first buffer) of one buffer chain and a first-stage buffer of the other buffer chain, and/or between a second-stage buffer (not necessarily a second buffer) of one buffer chain and a second-stage buffer of the other buffer chain, etc.

The buffers may comprise, or the or each clock path may comprise, at least one first buffer and at least one second buffer; and the control circuitry may be configured, when controlling the DC bias signals, to change the value of the DC bias signal applied to the input terminal of each first buffer in a first relative direction and to change the value of the DC bias signal applied to the input terminal of each second buffer in a second relative direction opposite to the first relative direction.

In other words, the control circuitry may be configured to increase the value of the DC bias signal applied to the input terminal of each first buffer (i.e. change the DC bias signal from its value when the measurement signals were generated to a value that is higher) and decrease the value of the DC bias signal applied to the input terminal of each second buffer. Or, the control circuitry may be configured to decrease the value of the DC bias signal applied to the input terminal of each first buffer and increase the value of the DC bias signal applied to the input terminal of each second buffer.

The buffers may comprise a plurality of first buffers, and the control circuitry may be configured to control the DC bias signals for the first buffers such that they have the same value as one another.

In other words, each first buffer may be connected to receive the same DC bias signal.

The buffers may comprise a plurality of second buffers, and the control circuitry may be configured to control the DC bias signals for the second buffers such that they have the same value as one another.

In other words, each second buffer may be connected to receive the same DC bias signal.

The control circuitry may be configured to output first and second DC bias signals whose values are symmetrically arranged around a given common-mode value, and the control circuitry may be configured to control each first buffer with the first DC bias signal and each second buffer with the second DC bias signal.

In other words, first and second DC bias signals may be output such that a given common mode value lies halfway between them, i.e. such that the given common mode value is the average of the first and second DC bias signals.

The control circuitry may comprise a differential amplifier or a processor connected to receive the signals having said difference at its input terminals and to output the DC bias signals based on that difference.

In the arrangement in which the control circuitry comprises a processor, the control circuitry may further comprise an analogue-to-digital converter (ADC) configured to receive the signals having the said difference and to output a digital signal to the processor indicative of the DC-level of each clock signal, and two digital-to-analogue converters (ADCs) via which the processor is configured to output the DC bias signals.

A said clock path or each clock path may further comprise clock shaping circuitry connected along that path and configured to modify the slope of one or more clock-signal edges, and/or the duration of one or more states, in that path.

In other words, further control of the duty cycle of the or each clock signal may be provided by clock shaping circuitry.

The control circuitry may be configured to apply the DC bias signals to the respective input terminals via respective resistors, or via any high-impedance component.

The buffers are CMOS (complementary metal on silicon) buffers comprising MOSFETs (metal oxide semiconductor field effect transistors), and wherein the transistor size increases from buffer to buffer along each clock path.

In other words, the size of the transistors within each buffer may increase from buffer to buffer along each clock path, so that transistors of a first-stage buffer are smaller than those of a second-stage buffer, which are in turn smaller than those of a third-stage buffer, etc., of each clock path.

According to an embodiment of a second aspect of the present invention, there is provided clock-controlled circuitry comprising the clock distribution circuitry of the aforementioned first aspect of the present invention, optionally wherein the clock-controlled circuitry is analogue-to-digital circuitry or digital-to-analogue circuitry or time-to-digital circuitry or phase-locked-loop circuitry or voltage-controlled-oscillator circuitry.

According to an embodiment of a third aspect of the present invention, there is provided integrated circuitry, such as an IC chip, comprising the clock distribution circuitry of the aforementioned first aspect of the present invention, or the clock-controlled circuitry of the aforementioned second aspect of the present invention.

According to an embodiment of a fourth aspect of the present invention, there is provided a clock distribution method for duty cycle control comprising: receiving an input clock signal at an input node of a clock path and outputting an output clock signal at an output node of the clock path, the clock path comprising a plurality of buffers connected in series, each of the buffers having an input terminal and an output terminal, the input terminal being connected to the clock path via a corresponding AC coupling capacitor, and the output clock signal having an output duty cycle; applying a DC bias signal to the input terminal of each of the plurality of buffers; obtaining a measurement signal indicative of the output duty cycle; and controlling the DC bias signals, based on a difference between the measurement signal and a reference signal, so as to control the output duty cycle.

Features of method aspects may apply equally to apparatus (circuitry) aspects, and vice versa.

Reference will now be made, by way of example only, to the accompanying drawings, of which:

FIG. 1.

Figure 1:
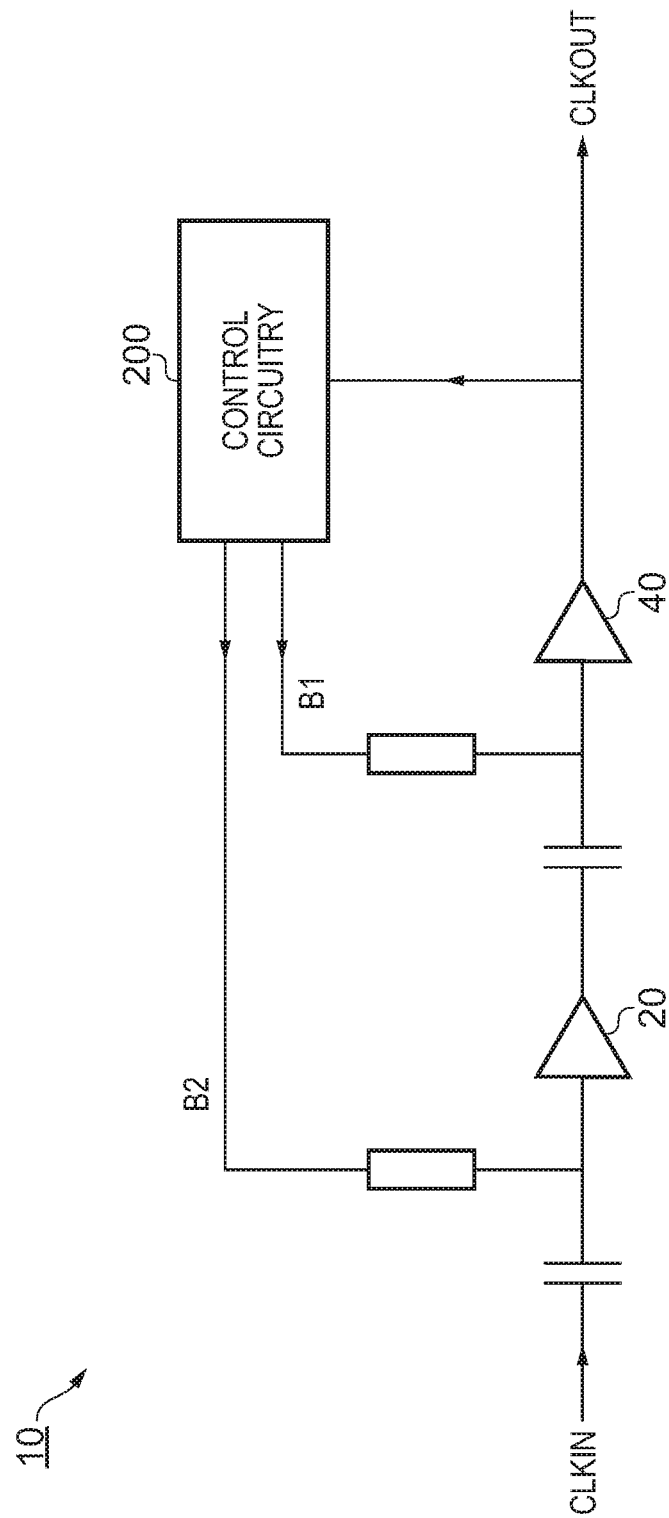
FIG. 1 is a schematic diagram of clock distribution circuitry.

FIG. 1 is a schematic diagram of clock distribution circuitry 10. Clock distribution circuitry 10 comprises buffers 20 and 40, and control circuitry 200. Buffers 20 and 40 may be implemented as CMOS buffers. Buffers 20 and 40 may be inverting buffers, and may be implemented as CMOS inverters.

Buffers 20 and 40 are connected together in series along a clock path. Buffer 20 is connected to receive into its input terminal a clock signal CLKIN, and buffer 40 is connected to output clock signal CLKOUT. Control circuitry 200 is connected to receive clock signal CLKOUT, and output DC bias signals B1 and B2. Buffer 20 is connected to receive DC bias signal B2 into its input terminal. Buffer 40 is connected to receive DC bias signal B1 into its input terminal.

Each buffer 20 and 40 is connected to receive the corresponding DC bias signal via a high-impedance component, for example a resistor as indicated.

For each of the buffers 20 and 40, a capacitor is connected along the clock path at a preceding stage (input terminal side) of the buffer. Each capacitor acts as a high-pass filter so that only the AC component of the clock signal propagated along the clock path is provided to the following buffer, and so the DC component of the clock signal input to each buffer is effectively filtered out. Each capacitor may be readily described as an AC coupling capacitor. Each DC bias signal may be provided to the input terminal of the corresponding buffer so as to bias a DC level of the clock signal at its input terminal. Each DC bias signal may be provided to the input terminal of the corresponding buffer via a resistor, for example a resistor with high impedance.

Control circuitry 200 is configured to generate DC bias signals B1 and B2 based on the duty cycle of clock signal CLKOUT. Control circuitry 200 may be further configured to generate DC bias signals B1 and B2 based on a difference between the duty cycle of clock signal CLKOUT and a target duty cycle, such that the effect of the DC bias signals is to bring the duty cycle of clock signal CLKOUT to or towards the target duty cycle. For example, control circuitry 200 may comprise a low-pass filter connected to receive clock signal CLKOUT output from buffer 40, and configured to output a measurement signal indicative of a DC-level of clock signal CLKOUT. That measurement signal may be compared with a reference signal indicative of a DC-level of a clock signal with the target duty cycle, and control circuitry 200 may output DC bias signals B1 and B2 based on the difference between the measurement signal and the reference signal (i.e. in order to bring the duty cycle of clock signal CLKOUT to or towards the target duty cycle).

Control circuitry 200 may be connected to receive a clock signal output from buffer 20 instead of clock signal CLKOUT output from buffer 40. Control circuitry 200 may be connected to receive another clock signal from along the clock path (for example if there are additional buffers along the clock path).

In an example in which buffers 20 and 40 are not inverting buffers, DC bias signals B1 and B2 may have the same value. In other words, there may be only one DC bias signal which is applied to both buffers 20 and 40.

In an example in which buffers 20 and 40 are inverting buffers, DC bias signals B1 and B2 may have values such that the effect of each DC bias signal on the duty cycle of the clock signal CLKOUT is the same (but not necessarily of the same magnitude). In other words, each DC bias signal may have the effect of reducing the duty cycle of clock signal CLKOUT, or each DC bias signal may have the effect of increasing the duty cycle of clock signal CLKOUT. In other words, control circuitry 200 may output DC bias signals B1 and B2 such that DC bias signal B2 to be applied to buffer 20 is reduced and DC bias signal B1 to be applied to buffer 40 is increased, or vice versa. For example, if the measured duty cycle of clock signal CLKOUT is higher than the target duty cycle, control circuitry 200 is configured to control DC bias signals B1 and B2 so that DC bias signal B2 is decreased and so that DC bias signal B1 is increased, so that the overall effect is to decrease the duty cycle of clock signal CLKOUT.

The buffer chain may comprise buffers other than buffers 20 and 40. Further buffers may receive DC bias signals B1 and B2 from control circuitry 200. Further buffers may receive no DC bias signals from control circuitry 200, or the DC bias signals that further buffers receive may be held constant and not controlled to be variable by control circuitry 200, or they may be controlled independently of (and differently from) DC bias signals B1 and B2.

Figure 2A:
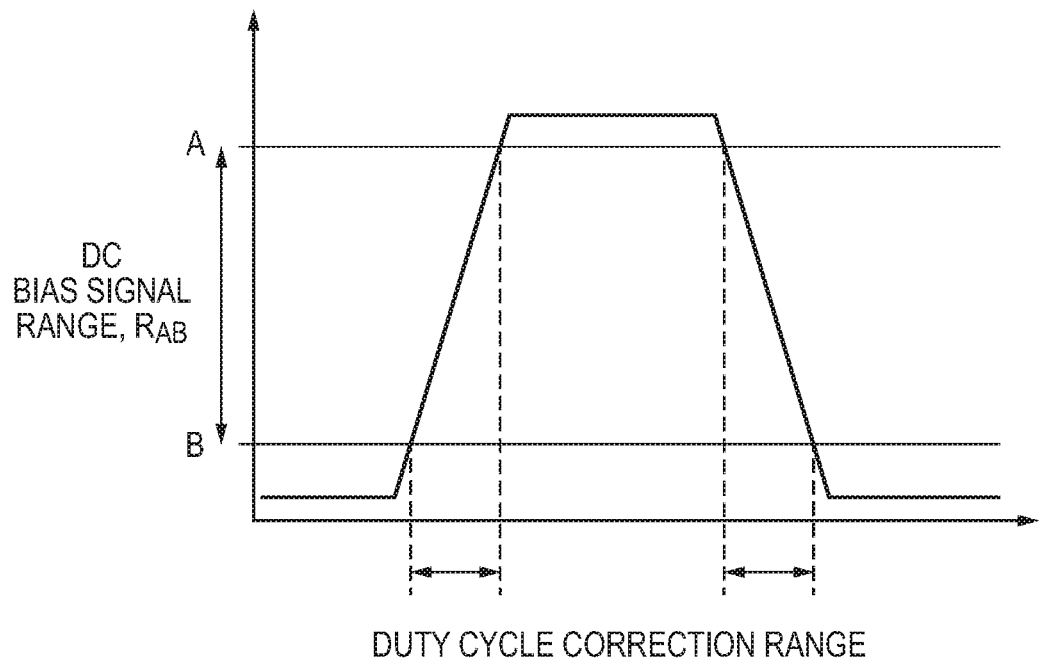
FIG. 2A is a signal timing diagram useful for understanding the circuitry of FIG. 1.

The operation of clock distribution circuitry 10 will now be described with reference to FIGS. 2A and 2B. FIG. 2A shows a pulse of a clock signal, for example clock signal CLKIN in FIG. 1. The levels A and B in FIG. 2A represent the switching threshold of a buffer, for example buffer 20, when a DC bias voltage applied to the input terminal of that buffer is changed. For example, the level A in FIG. 2 represents the switching threshold of the buffer when a DC bias signal, for example B2, is applied to the buffer, and the level B in FIG. 2 represents the switching threshold of the buffer when the voltage level of the DC bias signal that is applied to the buffer is increased. In other words, the voltage level of a DC bias signal applied to the buffer is increased so that the switching threshold of the buffer is decreased from level A to level B in FIG. 2A. By changing a DC bias voltage that is applied to a buffer, for example buffer 20, the duty cycle of the clock signal output by that buffer is changed.

Figure 2B:
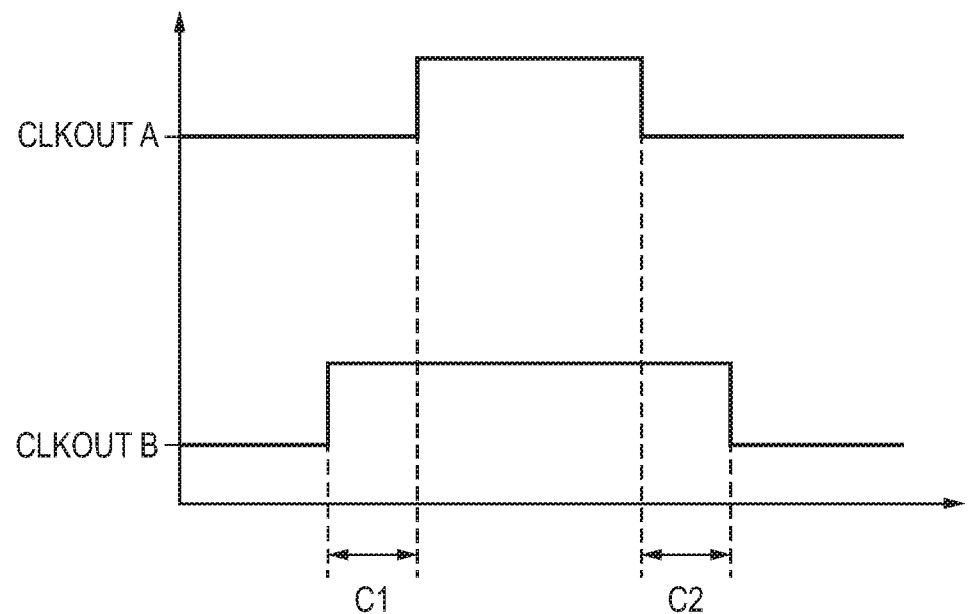
FIG. 2B is a signal timing diagram useful for understanding the circuitry of FIG. 1.

Taking buffer 20 to be a non-inverting buffer, FIG. 2B shows examples of the pulse resulting from a buffer when a DC bias signal applied to the buffer is changed (the pulse is shown in FIG. 2B as an idealised square-wave pulse, for simplicity). For example, CLKOUTA in FIG. 2B is a pulse of the clock signal output from buffer 20 when DC bias signal B2 is set to have a first value which causes the switching threshold of buffer 20 to be at voltage level A in FIG. 2A, and CLKOUTB in FIG. 2B is a pulse of the clock signal output from buffer 20 when DC bias signal B2 is set to have a second value which is higher than the first value and which causes the switching threshold of buffer 20 to be at voltage level B in FIG. 2A. It is therefore readily apparent from FIGS. 2A and 2B that when DC bias signal B2 applied to buffer 20 is increased from the first value to the second value, causing the switching threshold of buffer 20 to change from the level A to the level B, the duty cycle of the clock signal output from buffer 20 is increased. The same principle applies to buffer 40.

FIGS. 2A and 2B also illustrate the range over which the duty cycle of a clock signal may be changed (which may be referred to as a duty cycle correction range) using a particular range of values for the DC bias signal. The difference between voltage levels A and B in FIG. 2A (labelled DC bias signal range, $R_{AB}$) is representative of the difference between the first and second values of the DC bias signal. For example, when the DC bias signal is changed from the first value to the second value, the pulse width of the pulse shown in FIG. 2B increases by an amount, C1+C2. Therefore, if the range of values for the DC bias signal is $R_{AB}$, then the duty cycle correction range is shown by C1 and C2 in FIG. 2B. It is readily apparent that reducing the slope of the clock signal illustrated in FIG. 2A would lead to a greater duty cycle correction range for the same range of values for a DC bias signal. However, a reduced slope means that any noise in the DC bias signal leads to increased jitter in the clock signal output from the buffer that receives the DC bias signal. The maximum range of values that the DC bias signal can take is limited by the threshold voltages of the transistors that make up buffers 20 and 40. This range may be further limited by other practical requirements and physical constraints.

For these reasons, it is desirable to have a large duty cycle correction range for a small DC bias signal range, without reducing the slope of the clock signal. This is achieved in clock distribution circuitry 10 by providing DC bias signals to multiple points along the clock path (i.e. to both buffers 20 and 40) so that although there is a relatively small duty cycle correction range at each buffer (e.g. <±1%), there is a relatively large duty cycle correction range overall (i.e. when the change in duty cycle over the entire clock path is considered), such as ±5% where there are 5 buffer stages (although it will be understood that the effect between stages may not be linear, and that the effect at each stage is not simply additive—the numbers here are for illustrating the general idea only).

Figure 3:
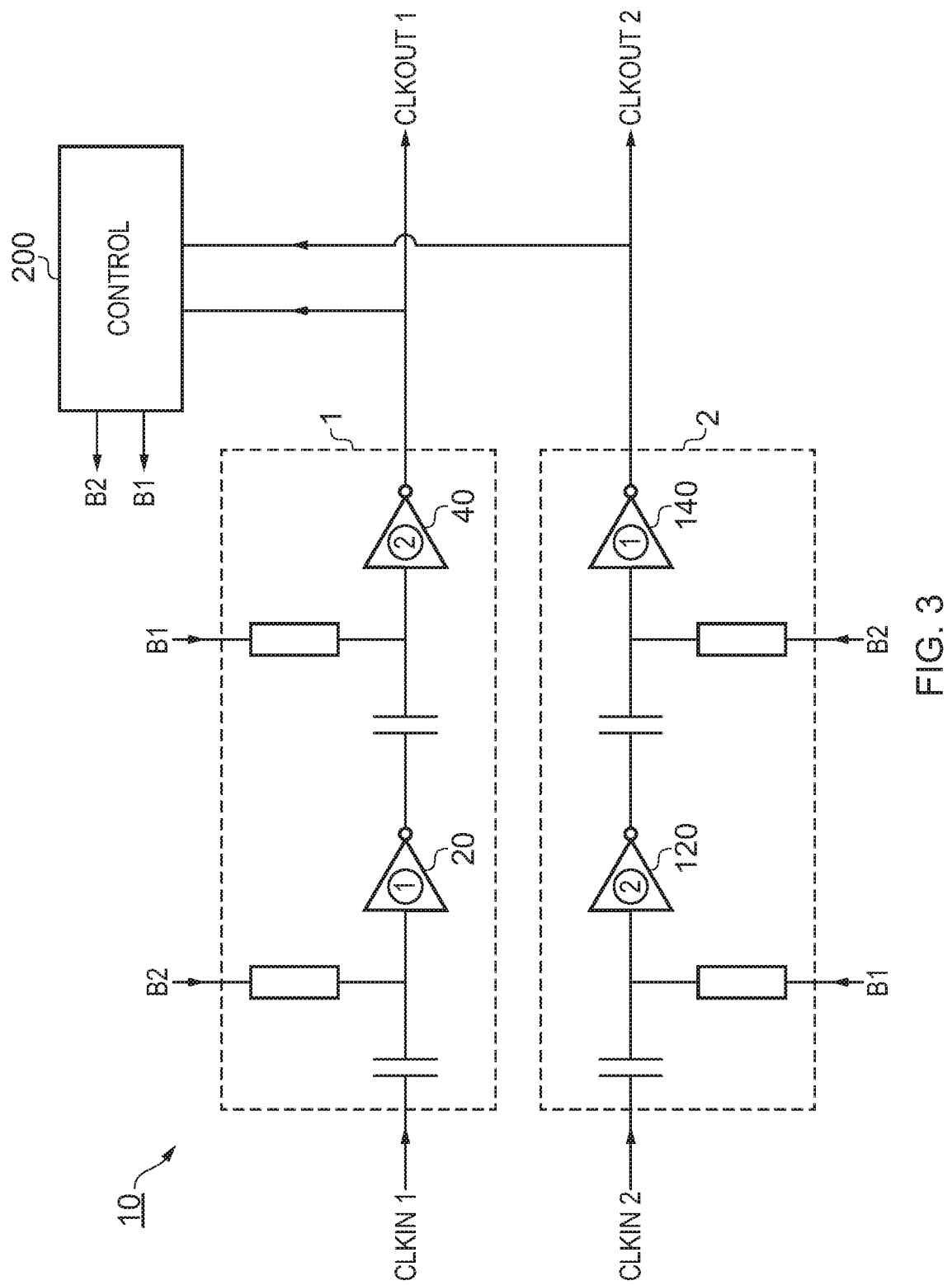
FIG. 3 is a schematic diagram of clock distribution circuitry.

FIG. 3 is a schematic diagram of another arrangement of clock distribution circuitry 10. Clock distribution circuitry 10 comprises a first group of buffers (first buffers) 20 and 140, a second group of buffers (second buffers) 40 and 120, and control circuitry 200. Buffers 20 and 40 are connected together in series to form a buffer chain 1 (which constitutes a clock path). Buffers 120 and 140 are connected together in series to form a buffer chain 2 (which constitutes another clock path). Buffer chain 1 is connected to receive a clock signal CLKIN1 and to output a clock signal CLKOUT1. Buffer chain 2 is connected to receive a clock signal CLKIN2 and to output a clock signal CLKOUT2. Buffers 20, 40, 120 and 140 are inverting buffers, and may be implemented as CMOS inverters. CLKIN1 and CLKIN2 may be complementary clock signals although this is not essential.

It can be seen from FIG. 3 that the first buffer 20 of buffer chain 1 is an odd-stage buffer, the first buffer 140 of buffer chain 2 is an even-stage buffer, the second buffer 40 of buffer chain 1 is an even-stage buffer, and the second buffer 120 of buffer chain 2 is an odd-stage buffer.

Control circuitry 200 is connected to receive clock signals CLKOUT1 and CLKOUT2, and output DC bias signals B1 and B2. Each buffer of the first group of buffers (first buffers) 20 and 140 is connected to receive DC bias signal B2 into its input terminal. Each buffer of the second group of buffers (second buffers) 40 and 120 is connected to receive DC bias signal B1 into its input terminal.

Each buffer 20, 40, 120 and 140 is connected to receive the corresponding DC bias signal via a high-impedance component, for example a resistor, as indicated.

For each of the buffers 20, 40, 120 and 140, a capacitor is connected along its clock path at a preceding stage (input terminal side) of the buffer. Each capacitor again acts as a high-pass filter so that only the AC component of the clock signal propagated along the clock path is provided to the corresponding buffer, and so the DC component of the clock signal input to each buffer is filtered out. Each capacitor may be readily described as an AC coupling capacitor. Each bias signal may be provided to the corresponding buffer via a resistor, for example a resistor with high impedance.

In the present arrangement, DC bias signal B2 is applied to each first buffer 20 and 140, and DC bias signal B1 is applied to each second buffer 40 and 120. However, in another arrangement, the DC bias signals applied to the first buffers 20 and 140 need not be the same as one another. In particular, provided that the direction in which the duty cycle of the clock signal is changed due to the effect of each DC bias signal on the corresponding first buffer 20 or 140 is unchanged from the ideal case in which the DC bias signals are identical, the DC bias signals need not be identical. Also, the DC bias signals applied to the second buffers 40 and 120 need not be the same as one another. In particular, provided that the direction in which the duty cycle of the clock signal is changed due to the effect of each DC bias signal on the corresponding second buffer 40 or 120 is unchanged from the ideal case in which the DC bias signals are identical, the DC bias signals need not be identical.

It is readily apparent from the order of buffers 20, 40, 120 and 140 in FIG. 3, and recalling that buffers 20 and 140 are first buffers and buffers 40 and 120 are second buffers, that the first buffer 20 of buffer chain 1 is configured to output a clock signal that is inverted compared to clock signal CLKIN1; the first buffer 140 of buffer chain 2 is configured to output a clock signal that is not inverted compared to clock signal CLKIN2; the second buffer 40 of buffer chain 1 is configured to output a clock signal that is not inverted compared to clock signal CLKIN1; and the second buffer 120 of buffer chain 2 is configured to output a clock signal that is inverted compared to clock signal CLKIN2. In this arrangement, each buffer chain 1 and 2 comprises an even number of inverting-stages (inverting buffers). In another arrangement in which each buffer chain 1 and 2 comprises an odd number of inverting-stages, the DC bias signals B1 and B2 are switched with one another, i.e. so that first buffers (as defined above) receive DC bias signal B1, and second buffers (as defined above) receive DC bias signal B2.

Control circuitry 200 may be configured to generate DC bias signals B1 and B2 based on the difference between the duty cycle of clock signal CLKOUT1 and the duty cycle of CLKOUT2, such that the effect of the DC bias signals is to bring the duty cycle of CLKOUT1 and the duty cycle of CLKOUT2 to or towards each other, i.e. if what is required is that the clock signals CLKOUT1 and CLKOUT2 have the same duty cycle.

Control circuitry 200 may be connected to receive a clock signal output from buffer 20 instead of clock signal CLKOUT1 output from buffer 40. Control circuitry 200 may be connected to receive a clock signal output from buffer 120 instead of clock signal CLKOUT2 output from buffer 140. Control circuitry 200 may be connected to receive another clock signal from along the clock path (for example if there are additional buffers along the clock path). A possible structure of control circuitry 200 is described below with reference to FIG. 4.

Control circuitry 200 may be connected to output DC bias signals to only buffer chain 1 and not to buffer chain 2, in order to bring the duty cycle of clock signal CLKOUT1 to or towards that of CLKOUT2. Control circuitry 200 may be connected to output DC bias signals to only buffer chain 2 and not to buffer chain 1, in order to bring the duty cycle of clock signal CLKOUT2 to or towards that of CLKOUT1. In other words, control circuitry 200 may be connected to output DC bias signals only to one of the buffer chains 1 and 2, such that the clock signal output from the other buffer chain acts only as a reference clock signal. In this case, control circuitry 200 may have a structure similar to that described in connection with the arrangement depicted in FIG. 1, except that the low-pass filter is connected to receive both clock signals CLKOUT1 and CLKOUT2, and to output the measurement signal based on clock signal CLKOUT1, and another measurement signal based on CLKOUT2. Control circuitry 200 then uses the measurement signal based on one of the clock signals, e.g. CLKOUT2, in place of the reference signal to control DC bias signals B1 and B2 to bring the duty cycle of one of the clock signals, e.g. CLKOUT1 to or towards that of the other clock signal, e.g. CLKOUT2.

Buffer chains 1 and 2 may comprise buffers other than buffers 20, 40, 120 and 140, These further buffers may receive DC bias signals from control circuitry 200, which is explained further below. Further buffers may receive no DC bias signals from control circuitry 200, or the DC bias signals that further buffers receive may be held constant and not controlled to be variable by control circuitry 200, or they may be controlled independently of (and differently from) DC bias signals B1 and B2.

Figure 4:
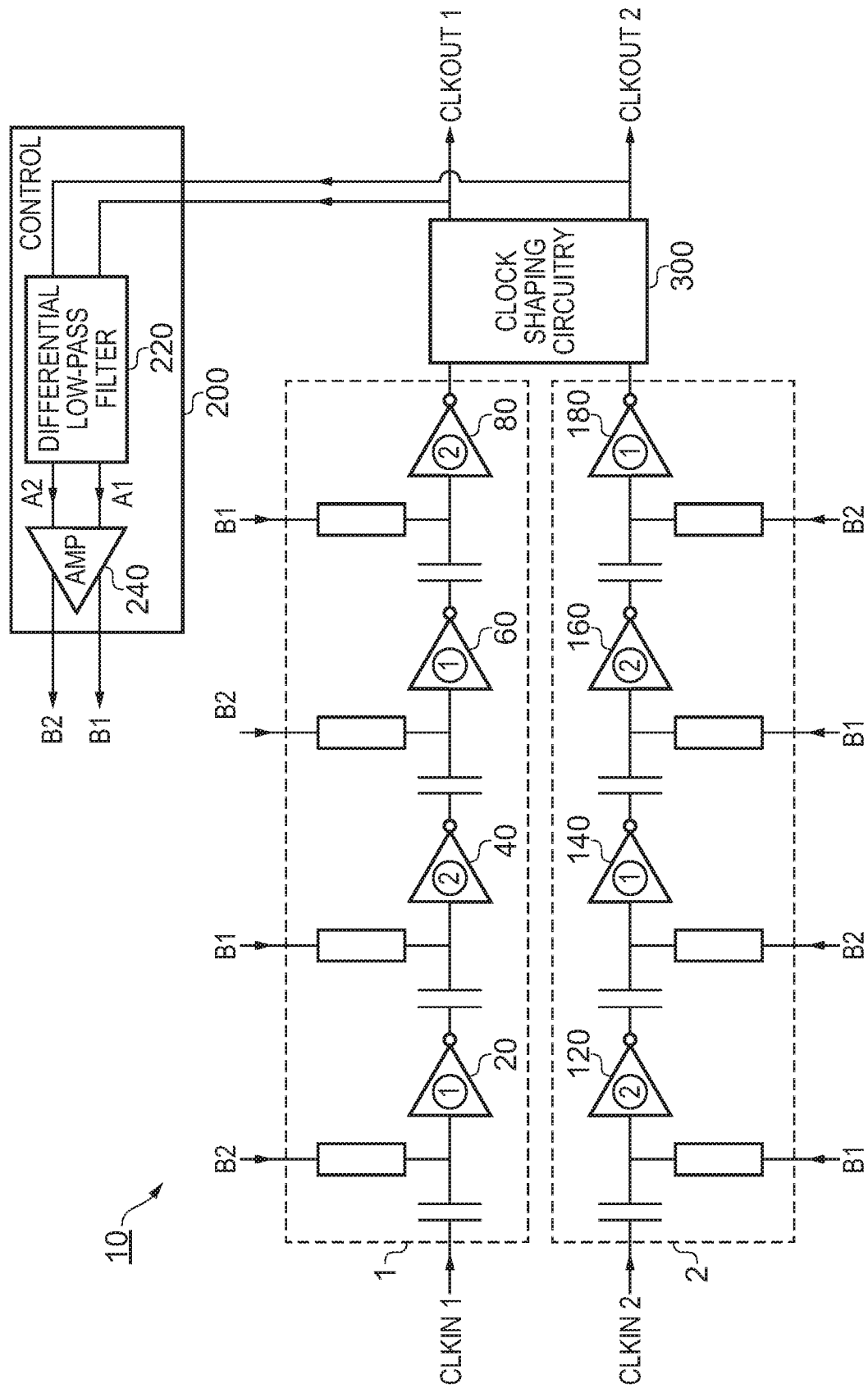
FIG. 4 is a schematic diagram of clock distribution circuitry.

FIG. 4 is a schematic diagram of another arrangement of clock distribution circuitry 10. Clock distribution circuitry 10 comprises a first group of first buffers 20, 60, 140 and 180, a second group of second buffers 40, 80, 120 and 160, clock shaping circuitry 300 and control circuitry 200.

Buffers 20, 40, 60 and 80 are connected together in series to form a buffer chain 1 (which constitutes a clock path). Buffers 120, 140, 160 and 180 are connected together in series to form a buffer chain 2 (which constitutes another clock path). Buffer chain 1 is connected to receive a clock signal CLKIN1 and to output a clock signal CLKOUT1 (via clock shaping circuitry 300). Buffer chain 2 is connected to receive a clock signal CLKIN2 and to output a clock signal CLKOUT2 (via clock shaping circuitry 300). Buffers 20, 40, 60, 80, 120, 140, 160 and 180 are inverting buffers, and may be implemented as CMOS inverters.

It can be seen from FIG. 4 that the first buffers 20 and 60 of buffer chain 1 are odd-stage buffers, the first buffers 140 and 180 of buffer chain 2 are even-stage buffers, the second buffers 40 and 80 of buffer chain 1 are even-stage buffers, and the second buffers 120 and 160 of buffer chain 2 are odd-stage buffers.

Control circuitry 200 is connected to receive clock signals CLKOUT1 and CLKOUT2, and output DC bias signals B1 and B2. Each buffer of the first group of buffers (first buffers) 20, 60, 140 and 180 is connected to receive DC bias signal B2 into its input terminal. Each buffer of the second group of buffers (second buffers) 40, 80, 120 and 160 is connected to receive DC bias signal B1 into its input terminal.

Each buffer 20, 40, 60, 80, 120, 140, 160 and 180 is connected to receive the corresponding DC bias signal via a high-impedance component, for example a resistor as indicated.

For each of the buffers 20, 40, 60, 80, 120, 140, 160 and 180, a capacitor is connected along its clock path at a preceding stage (input terminal side) of the buffer. Each capacitor acts as a high-pass filter so that only the AC component of the clock signal propagated along the clock path is provided to the corresponding buffer, and so the DC component of the clock signal input to each buffer is filtered out. Each capacitor may be readily described as an AC coupling capacitor. Each bias signal may be provided to the corresponding buffer via a resistor, for example a resistor with high impedance.

In the present arrangement, the same DC bias signal B2 is applied to each first buffer 20, 60, 140 and 180, and the same DC bias signal B1 is applied to each second buffer 40, 80, 120 and 160. However, in another arrangement, the DC bias signals applied to the first buffers 20, 60, 140 and 180 need not be the same as one another. In particular, provided that the direction in which the duty cycle of the clock signal is changed due to the effect of each DC bias signal on the corresponding first buffer 20 or 140 is unchanged from the ideal case in which the DC bias signals are identical, the DC bias signals need not be identical. Also, the DC bias signals applied to the second buffers 40, 80, 120 and 160 need not be the same as one another. In particular, provided that the direction in which the duty cycle of the clock signal is changed due to the effect of each DC bias signal on the corresponding second buffer 40 or 120 is unchanged from the ideal case in which the DC bias signals are identical, the DC bias signals need not be identical.

It is readily apparent from the order of buffers 20, 40, 60, 80, 120, 140, 160 and 180 in FIG. 4 that first buffers 20 and 60 of buffer chain 1 are configured to output a clock signal that is inverted compared to clock signal CLKIN1; first buffers 140 and 180 of buffer chain 2 are configured to output a clock signal that is not inverted compared to clock signal CLKIN2; second buffers 40 and 80 of buffer chain 1 are configured to output a clock signal that is not inverted compared to clock signal CLKIN1; and second buffers 120 and 160 of buffer chain 2 are configured to output a clock signal that is inverted compared to clock signal CLKIN2. In this arrangement, each buffer chain 1 and 2 comprises an even number of inverting-stages (inverting buffers). In another arrangement in which each buffer chain 1 and 2 comprises an odd number of inverting-stages, the DC bias signals B1 and B2 are switched with one another, i.e. so that first buffers (as defined above) receive DC bias signal B1, and second buffers (as defined above) receive DC bias signal B2.

Clock shaping circuitry 300 is connected to receive a clock signal output from buffer chain 1 and a clock signal output from buffer chain 2, and outputs clock signals CLKOUT1 and CLKOUT2. Clock shaping circuitry 300 is configured to modify one or more edges of the clock signal output from each buffer chain in order to generate clock signals CLKOUT1 and CLKOUT2. Clock shaping circuitry 300 may receive just the clock signals output from one of the buffer chains 1 and 2. Clock shaping circuitry 300 may modify an edge of a clock signal by modifying the slope of the edge and/or clock shaping circuitry 300 may modify an edge of a clock signal by modifying the duration of a state. Clock shaping circuitry 300 may be implemented in any of the other arrangements of clock distribution circuitry 10, for example those illustrated in FIGS. 1 and 3. Clock shaping circuitry 300 need not be included in the clock distribution circuitry 10 of the present arrangement.

Control circuitry 200 comprises differential low-pass filter 220 and differential amplifier 240.

Differential low-pass filter 220 is connected to receive clock signal CLKOUT1 output from buffer chain 1 (via clock shaping circuitry 300) and clock signal CLKOUT2 output from buffer chain 2 (via clock shaping circuitry 300). Differential low-pass filter 220 is configured to generate a measurement signal A1 based on clock signal CLKOUT1, which is indicative of a DC-level of clock signal CLKOUT1. Differential low-pass filter 220 is configured to generate a measurement signal A2 based on clock signal CLKOUT2, which is indicative of a DC-level of clock signal CLKOUT2. Measurement signals A1 and A2 may for example be DC versions (DC-filtered clock signals) of the clock signals CLKOUT1 and CLKOUT2, respectively.

Differential amplifier 240 is connected to receive measurement signals A1 and A2, and is configured to output DC bias signals B1 and B2. Differential amplifier 240 outputs DC bias signals B1 and B2 based on the difference between measurement signals A1 and A2. For example, one DC bias value takes a value that is less than a common-mode value of the differential amplifier, and the other DC bias signal takes a value that is more than the common-mode value. For example, the DC bias signals may be symmetrical about the common-mode value (the differential amplifier 240 may be considered a fully symmetrical amplifier, for example an open-loop fully symmetrical amplifier or another fully symmetrical amplifier with high gain). Differential amplifier 240 outputs DC bias signals B1 and B2 so that the amount by which the DC bias signals B1 and B2 are different from the common-mode is larger (determined by the amplifier gain) if the difference between measurement signals A1 and A2 is relatively large, and so that the amount by which the DC bias signals B1 and B2 are different from the common-mode is smaller (determined by the amplifier gain) if the difference between measurement signals A1 and A2 is relatively small. When the difference between measurement signals A1 and A2 is zero, differential amplifier 240 is configured to output the common-mode as both DC bias signals B1 and B2.

In an example, the duty cycle of clock signal CLKOUT1 is 55%, and the duty cycle of clock signal CLKOUT2 is 75%. Differential low-pass filter 220 outputs measurement signals A1 and A2 indicative of duty cycles of 55% and 75%, for example such that A2 is higher than A1. Differential amplifier 240 receives measurement signals A1 and A2 and outputs DC bias signals B1 and B2 based on the difference between measurement signals A1 and A2. In other words, control circuitry 200 controls DC bias signals B1 and B2 applied to the input terminals of buffers of buffer chains 1 and 2 so that DC bias signal B2, which is applied to the first buffers 20, 60, 140 and 180, is increased (which has the effect of increasing the duty cycle of clock signal CLKOUT1 and decreasing the duty cycle of clock signal CLKOUT2) and so that DC bias signal B1, which is applied to the second buffers 40, 80, 120 and 160, is decreased (which also has the effect of decreasing the duty cycle of clock signal CLKOUT1 and increasing the duty cycle of clock signal CLKOUT2). In this example, the duty cycle of clock signal CLKOUT 1 and that of CLKOUT2 eventually both become 65%, such that measurement signals A1 and A2 are the same, which causes differential amplifier 240 to output the common-mode as DC bias signals B1 and B2.

In a more typical example, the duty cycle of clock signal CLKOUT1 and that of CLKOUT2 may eventually settle at values closer to 50%.

The common-mode value may be the value of DC bias signal that would cause no change in the duty cycle of each clock buffer.

It is readily apparent that the structure of control circuitry 200 as illustrated in FIG. 4 may be implemented in the arrangement of clock distribution circuitry depicted in FIG. 3 (when DC bias signals B1 and B2 are provided to buffers of both buffer chain 1 and buffer chain 2).

Buffer chains 1 and 2 may comprise buffers other than buffers 20, 40, 60, 80, 120, 140, 160 and 180 (i.e. more stages). Some or all of these further buffers may receive DC bias signals from control circuitry 200. Further buffers may receive no DC bias signals from control circuitry 200, or the DC bias signals that further buffers receive may be held constant and not controlled to be variable by control circuitry 200, or they may be controlled independently of (and differently from) DC bias signals B1 and B2.

Figure 5:
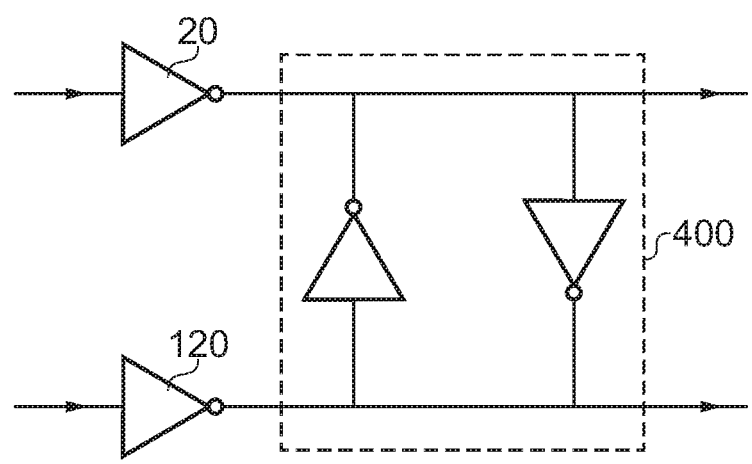
FIG. 5 is a schematic diagram of a cross-coupled inverter pair.

In both arrangements of clock distribution circuitry 10 depicted in FIG. 3 and in FIG. 4, and provided clock signals CLKIN1 and CLKIN2 are complementary clock signals, clock distribution circuitry 10 may further comprise one or more cross-coupled pairs of inverters connected between corresponding buffers of each buffer chain 1 and 2 (i.e. a cross-coupled inverter pair may be connected between the output terminal of the first-stage buffer 20 of buffer chain 1 and the output terminal of the first stage buffer 120 of buffer chain 2). A cross coupled inverter pair 400 is illustrated in FIG. 5.

The effect of a cross-coupled pair of inverters is to reduce skew between the two clock signals CLKOUT1 and CLKOUT2, when the clock signals CLKIN1 and CLKIN2 are complementary clock signals. For example, a practical target may be for the clock signals CLKIN1 and CLKIN2 to be identical with half a period delay (which, dependent on clock shape, might not mean that both have exactly a 50% duty cycle). It will be appreciated that the control circuitry 200 seeks to equalise the CLKIN1 and CLKIN2 DC-filtered clock signals or path average values.

Clock signals CLKIN1 and CLKIN2 as described in any of the arrangements of clock distribution circuitry 10 may be complementary clock signals and, as such, may have the same frequency and be 180 degrees out of phase with each other (within some defined tolerance). In other words, the phase difference between clock signals CLKIN1 and CLKIN2 may be substantially 180 degrees. In other words, clock signals CLKIN1 and CLKIN2 may be in antiphase with each other. Similarly, clock signals CLKOUT1 and CLKOUT2 may be complementary clock signals.

It will be appreciated that the arrangements of clock distribution circuitry 10 depicted in FIG. 3 and in FIG. 4 may be duplicated to provide quadrature clock signals, i.e. with each having its own pair of complementary clock signals CLKIN1 and CLKIN2, but the two pairs together forming quadrature clock signals.

In another arrangement, control circuitry 200 may comprise a differential low-pass filter, an analogue-to-digital converter (ADC), a processor and first and second digital-to-analogue-converters (DACs). In this arrangement, the low-pass filter is connected to receive clock signals CLKOUT1 and CLKOUT2 (or clock signals output from any buffer of each chain) and to output two analogue signals, each indicative of a DC level of a said clock signal, to the ADC. The ADC is connected to receive the analogue signals indicative of a DC level of each clock signal, and to output a digital signal indicative of a DC level of both clock signals. The processor is connected to receive the signal from the ADC and is configured to output, via the DACs, the DC bias signals B1 and B2.

Figure 6:
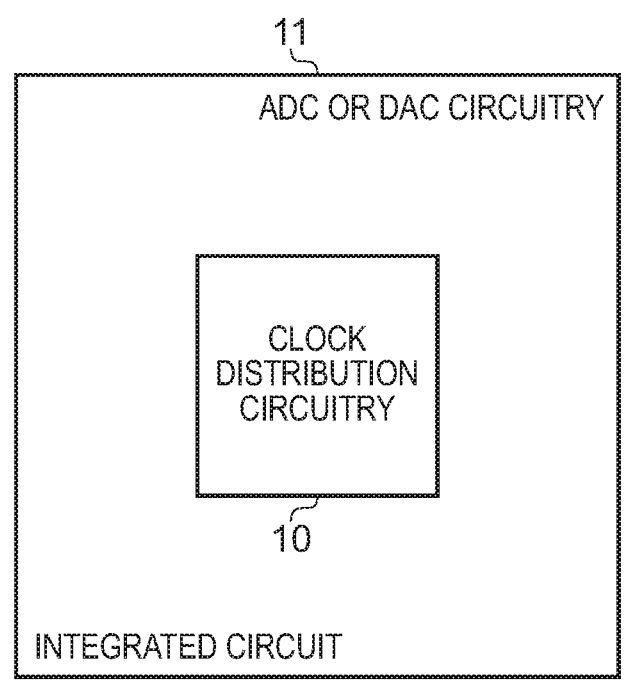
FIG. 6 is a schematic diagram of digital-to-analogue converter (DAC) circuitry or analogue-to-digital converter (ADC) circuitry which may comprise the clock distribution circuitry of e.g.

It will be appreciated that clock distribution circuitry 10 embodying the present invention could be provided along with mixed-signal circuitry such as DAC or ADC circuitry. For example, clock distribution circuitry 10 disclosed herein—provided along with DAC or ADC circuitry—could be described as a DAC or an ADC 11, as illustrated in FIG. 6. Clock distribution circuitry 10 could also be provided as part of or coupled to any other circuitry employing clock signals, such as Time-to-Digital converters (TDC), Phase Locked Loops (PLL) or Voltage Controlled Oscillators (VCO).

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards. Circuitry of the present invention may also be implemented with discrete components provided on circuit boards. Circuitry of the present invention may be implemented alone (as a standalone circuit) or together with other circuitry.

In any of the above method aspects, the various features as appropriate may be implemented in hardware, or as software modules running on one or more processors. Features of one aspect may be applied to any of the other aspects.

The invention also provides a computer program or a computer program product for carrying out any of the methods described herein, and a computer readable medium having stored thereon a program for carrying out any of the methods described herein. A computer program embodying the invention may be stored on a computer-readable medium, or it could, for example, be in the form of a signal such as a downloadable data signal provided from an Internet website, or it could be in any other form.

Further embodiments may be provided within the spirit and scope of the present invention as disclosed herein.

The invention claimed is:

1. Clock distribution circuitry configured for duty cycle control, the circuitry comprising:
   a first plurality of buffers connected in series along a first clock path having a first input node and a first output node, each of the first plurality of buffers having an input terminal and an output terminal, the input terminal being connected to the first clock path via a corresponding AC coupling capacitor, and the first clock path configured to receive a first input clock signal at the first input node and output a first output clock signal at the output node, the first output clock signal having a first output duty cycle;
   a second plurality of buffers connected in series along a second clock path having a second input node and a second output node, each of the second plurality of buffers having an input terminal and an output terminal, the input terminal being connected to the second clock path via a corresponding AC coupling capacitor, and the second clock path configured to receive a second input clock signal at the second input node and output a second output clock signal at the second output node, the second output clock signal having a second output duty cycle; and
   control circuitry, connected to apply a DC bias signal to the input terminal of each of the first plurality of buffers and each of the second plurality of buffers,
   wherein the control circuitry is configured to obtain a first measurement signal indicative of the first output duty cycle and a second measurement signal indicative of the second output duty cycle, and
   wherein the control circuitry comprises a differential amplifier configured to:
      receive the first and second measurement signals; and
      output the DC bias signals based on a difference between the first and second measurement signals so as to bring the first and second output duty cycles towards or to one another.

2. The clock distribution circuitry according to claim 1, wherein the control circuitry comprises low-pass filter circuitry configured to:
   receive the first output clock signal or another clock signal from along the first clock path and output the first measurement signal, the first measurement signal being indicative of a DC-level of the first output clock signal; and
   receive the second output clock signal or another clock signal from along the second clock path and output the second measurement signal, the second measurement signal being indicative of a DC-level of the second output clock signal.

3. The clock distribution circuitry according to claim 1, wherein the buffers are inverting buffers, and wherein each of said buffers is either:
   a first buffer which is in the first clock path and outputs a clock signal which is inverted compared to the first input clock signal or is in the second clock path and outputs a clock signal which is not inverted compared to the second input clock signal; or
   a second buffer which is in the second clock path and outputs a clock signal which is inverted compared to the second input clock signal or is in the first clock path and outputs a clock signal which is not inverted compared to the first input clock signal.

4. The clock distribution circuitry according to claim 3, wherein the first and second input clock signals are complementary clock signals,
   optionally wherein:
   the first and second clock paths comprise the same number of said buffers as one another; and
   the clock distribution circuitry further comprises at least one cross-coupled pair of inverters connected between corresponding nodes along the first and second clock paths.

5. The clock distribution circuitry according to claim 3, wherein:
   each clock path comprises at least one first buffer and least one second buffer; and
   the control circuitry is configured, when controlling the DC bias signals, to change the value of the DC bias signal applied to the input terminal of each first buffer in a first relative direction and to change the value of the DC bias signal applied to the input terminal of each second buffer in a second relative direction opposite to the first relative direction.

6. The clock distribution circuitry according to claim 5, wherein the buffers comprise a plurality of first buffers, and the control circuitry is configured to control the DC bias signals for the first buffers such that they have the same value as one another.

7. The clock distribution circuitry according to claim 5, wherein the buffers comprise a plurality of second buffers, and the control circuitry is configured to control the DC bias signals for the second buffers such that they have the same value as one another.

8. The clock distribution circuitry according to claim 5, wherein the control circuitry is configured to output first and second DC bias signals whose values are symmetrically arranged around a given common-mode value, and wherein the control circuitry is configured to control each first buffer with the first DC bias signal and each second buffer with the second DC bias signal.

9. The clock distribution circuitry according to claim 1, wherein the buffers are CMOS buffers comprising MOSFETs each having a transistor size, and wherein the transistor size increases from buffer to buffer along each clock path.

10. Clock-controlled circuitry comprising the clock distribution circuitry as claimed in claim 1, optionally wherein the clock-controlled circuitry is analogue-to-digital circuitry or digital-to-analogue circuitry or time-to-digital circuitry or phase-locked-loop circuitry or voltage-controlled-oscillator circuitry.

\* \* \* \* \*